United States Patent
Gao et al.

(10) Patent No.: US 9,423,247 B2
(45) Date of Patent: Aug. 23, 2016

(54) POSITIONING GRAPHIC COMPONENT FOR SUBSTRATE DETECTION AND METHOD OF MANUFACTURING THE SAME

(71) Applicant: SHENZHEN CHINA STAR OPTOELECTRONICS TECHNOLOGY CO., LTD., Shenzhen (CN)

(72) Inventors: Dongzi Gao, Shenzhen (CN); Li Chai, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 14/416,687

(22) PCT Filed: Jul. 16, 2014

(86) PCT No.: PCT/CN2014/082352
§ 371 (c)(1),
(2) Date: Jan. 23, 2015

(87) PCT Pub. No.: WO2015/192432
PCT Pub. Date: Dec. 23, 2012

(65) Prior Publication Data
US 2015/0369594 A1    Dec. 24, 2015

(30) Foreign Application Priority Data

Jun. 18, 2014 (CN) .......................... 2014 1 0274153

(51) Int. Cl.
*G01B 11/00* (2006.01)
*G01B 11/27* (2006.01)
*H01L 23/544* (2006.01)

(52) U.S. Cl.
CPC .............. *G01B 11/27* (2013.01); *H01L 23/544* (2013.01); *H01L 2223/5442* (2013.01); *H01L 2223/54426* (2013.01); *H01L 2223/54486* (2013.01); *H01L 2924/0002* (2013.01)

(58) Field of Classification Search
CPC ..... G03F 7/70633; G03F 9/70; G03F 9/7076; G03F 9/7088; G03F 9/7049
USPC ....................... 356/401; 438/14–18, 149–155
See application file for complete search history.

(56) References Cited

U.S. PATENT DOCUMENTS

| 4,520,041 A * | 5/1985 | Aoyama ............. H01L 21/7684 257/641 |
| 9,041,013 B2 * | 5/2015 | Lee ....................... H01L 33/486 257/100 |

(Continued)

FOREIGN PATENT DOCUMENTS

| CN | 1815321 A | 8/2006 |
| CN | 101576790 A | 11/2009 |

(Continued)

OTHER PUBLICATIONS

International Search Report (Forms PCT/ISA/210 and PCT/ISA/220) and the Written Opinion (Form PCT/ISA/237) ssued on Mar. 20, 2015, by the State Intellectual Property Office of China acting as the International Searching Authority in corresponding International Application No. PCT/CN2014/082352. (12 pages).

*Primary Examiner* — Tarifur Chowdhury
*Assistant Examiner* — Md M Rahman
(74) *Attorney, Agent, or Firm* — Buchanan Ingersoll & Rooney PC

(57) ABSTRACT

The present disclosure discloses a positioning graphic component for substrate detection and a method of manufacturing the same. The positioning graphic component for substrate detection comprises at least two layers of metal layer patterns and an insulation layer placed between any two layers of metal layer patterns. The present disclosure solves the problem of the occurrence of an incomplete positioning graphic component due to incomplete coverage by the insulation layer in processing TFT LCDs, thus improving the yield.

10 Claims, 4 Drawing Sheets

(56) References Cited

U.S. PATENT DOCUMENTS

| | | |
|---|---|---|
| 2005/0064676 A1 | 3/2005 | Tobioka et al. |
| 2007/0045790 A1 | 3/2007 | Ishizaka |
| 2007/0284586 A1* | 12/2007 | Park ............... H01L 27/1214 257/72 |
| 2014/0097439 A1* | 4/2014 | Jeon ............... H01L 27/124 257/71 |
| 2015/0014637 A1* | 1/2015 | Lim ............... H01L 27/124 257/40 |
| 2015/0168773 A1* | 6/2015 | Chen ............... G02F 1/133514 349/106 |
| 2015/0318305 A1* | 11/2015 | Zhang ............... G02F 1/136286 257/773 |

FOREIGN PATENT DOCUMENTS

| | | |
|---|---|---|
| CN | 102509696 A | 6/2012 |
| CN | 102945842 A | 2/2013 |
| JP | 2007-067272 A | 3/2007 |

* cited by examiner

POSITIONING GRAPHIC COMPONENT FOR SUBSTRATE DETECTION AND METHOD OF MANUFACTURING THE SAME

The present application claims benefit of Chinese patent application CN 201410274153.5, entitled "Positioning graphic component for substrate detection and method for manufacturing the same" and filed on Jun. 18, 2014, the entirety of which is incorporated herein by reference.

FIELD OF THE INVENTION

The present disclosure relates to the field of manufacturing of thin film transistor liquid crystal displays, i.e., TFT LCD, in particular to a positioning graphic component for substrate detection and a method of manufacturing the same.

BACKGROUND OF THE INVENTION

The development of the industry of TFT LCDs (Thin Film Transistor Liquid Crystal Displays) and intensified competition thereof render maximization of glass utilization effective for improving product competitiveness. In order to improve glass utilization, a mask plate should be designed adjacent to edges of the glass as much as possible.

A positioning graphic component (such as a cross), as an auxiliary process structure arranged on a glass substrate, is usually placed on an outermost side of the glass substrate. FIG. 1 shows a glass substrate having four crosses respectively provided on the four corners thereof Positioning graphic components are substantially used for aligning various detection devices with the glass substrate in the processes of detecting defects, measuring sizes, film thickness, and line width, testing electric performance, and cell and assembling, etc.

Positioning graphic components in the prior art generally have a monolayer metal structure, which will be explained by taking a cross as an example. As indicated in FIG. 2, the cross is patterned during formation of a first layer of metal film in manufacturing an array substrate. An silicon nitride insulating material 22 is deposited on the patterned cross 20 via the chemical vapor deposition, wherein the silicon nitride insulating material 22 is capable of protecting the cross 20 from being etched in a subsequent etching step.

In actual manufacture of the positioning graphic component, however, the following problems might arise. Due to the restriction of chemical vapor deposition devices themselves, it is impossible for a filming area obtained from the devices to cover the edges of a glass entirely, which causes a portion of the positioning graphic component that has not been covered by the insulating film to be etched in subsequent procedures. Thus, the positioning graphic component may be incomplete.

FIG. 3(a) illustrates the positioning graphic component 20 patterned during formation of the first layer of metal film; FIG. 3(b) shows deposition, on the positioning graphic component 20, of the silicon nitride insulating material 22, which, however only covers a right portion of the positioning graphic component 20; and FIG. 3(c) shows the positioning graphic component after etching, from which it can be clearly seen that a left portion of the positioning graphic component without the protection of the insulating material is etched.

In lack of a complete positioning graphic component that can be used by a detection device, the glass substrate would be processed as waste, thus causing unnecessary losses in the production.

As a result, due to the above problems existing in the prior art, it is in urgent need in the process of manufacturing TFT LCDs to find an effective solution for preventing an incomplete positioning graphic component.

SUMMARY OF THE INVENTION

To solve the above problems, the present disclosure provides a new positioning graphic component for substrate detection, comprising: at least two layers of metal layer patterns and an insulation layer placed between any two layers of metal layer patterns.

In one embodiment, the positioning graphic component for substrate detection further comprises an insulation layer covering an outermost layer of the at least two layers of metal layer patterns.

In one embodiment, the metal layer pattern includes a cross.

In one embodiment, the at least two layers of metal layer patterns are of the same size.

According to another aspect of the present disclosure, it further provides a method of manufacturing a positioning graphic component for substrate detection, comprising at least the following: Step (1): depositing a metal material on a substrate to form a first layer of metal film; Step (2): coating a photoresist material on the first layer of metal film, and transferring a pattern on a mask plate to the photoresist material; Step (3): etching a portion of the first layer of metal film that is not covered by the photoresist material; Step (4): removing the photoresist material to obtain a first layer of metal layer pattern; Step (5): depositing an insulating material on the first layer of metal layer pattern to form a layer of insulating film; Step (6): depositing a metal material to form a second layer of metal film on the insulating film; Step (7): coating a photoresist material on the second layer of metal film, and transferring the pattern on the mask plate to the photoresist material; Step (8): etching a portion of the second layer of metal film that is not covered by the photoresist material; and Step (9): removing the photoresist material to obtain a second layer of metal layer pattern, wherein the graphic component at least comprising the first layer of metal layer pattern, the second layer of metal layer pattern, and the insulating film is used as the positioning graphic component for substrate detection.

In one embodiment, the method further comprises depositing an insulating material on the second layer of metal layer pattern to form a layer of insulating film.

In one embodiment, the pattern on the mask plate comprises a cross.

In one embodiment, the method further includes the step of etching the portion of the first or second layer of metal film that is not covered by the photoresist material through wet etching.

The present disclosure has brought about the following beneficial effects.

Through using the positioning graphic component having at least two layers of metal layer patterns, the present disclosure can solve the problem of the occurrence of an incomplete positioning graphic component due to incomplete coverage by the insulation layer in processing TFT LCDs, thus improving the yield.

Other features and advantages of the present disclosure will be illustrated and become partly obvious in the following description, and be understood through implementation of the present disclosure. The purposes and other advantages of the present disclosure will be achievable or obtainable through the structures as indicated in the following description, claims, and drawings.

DETAILED DESCRIPTION OF THE EMBODIMENTS

Figure 1:
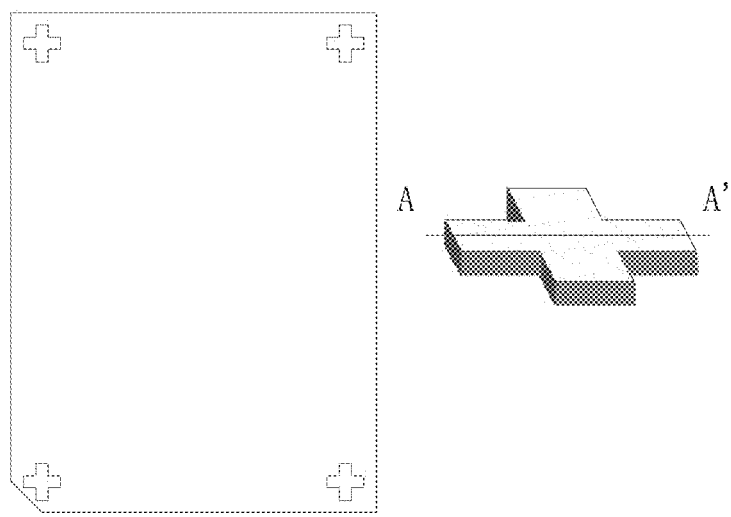
FIG. 1 schematically shows the locations of positioning graphic components on a glass substrate.

The embodiments of the present disclosure will be further explained in connection with drawings, whereby the procedures can be fully understood and therefore implemented as to how the present disclosure solves the technical problems by using the technical means and achieves the technical effects thereof. It should be noted that, as long as there are no conflicts, the technical features disclosed in each and every embodiment of the present disclosure can be combined with one another in any way, and all technical solutions formed are within the scope of the present disclosure.

The following embodiments are explained with reference to the appended drawings specifically illustrating implementable embodiments of the present disclosure. Direction terms used in the present disclosure, such as "upper", "lower", "left", and "right," refer to respective directions relative to the drawings. Hence, the direction terms used herein are intended to explain for understanding, rather than to limit the present disclosure.

Moreover, for the sake of clarity, the sizes and thickness of the components indicated in the drawings are not illustrated in scale, and the present disclosure is not limited to this.

FIGS. 4(a) to 4(g) are flow charts of the method of manufacturing a positioning graphic component for substrate detection (hereinafter referred to as the positioning graphic component) according to one embodiment of the present disclosure. The steps of the embodiment will be explained in detail in conjunction with FIGS. 4(a) to 4(g).

It should be noted that for the sake of convenience, only the method of manufacturing the positioning graphic component comprising two layers of metal layer patterns will be explained. Nevertheless, it can be easily understood that under certain circumstances, the positioning graphic component can, for example, be designed as having three or more metal layer patters as required.

In Step (1), a metal material is deposited on a substrate with a physical vapor deposition device to form a first layer of metal film.

The metal film can be used for forming a first layer of metal layer pattern of the positioning graphic component.

In this step, a sputtering process can be used for depositing the metal film on the substrate, wherein the metal material can preferably comprise tantalum, molybdenum, chromium, titanium/aluminum/titanium, molybdenum/tantalum, molybdenum/tungsten, etc.

In addition, depending on different products, the film can be designed in thickness of 500 Å, 1000 Å, or 1800 Å. The first metal film deposited is shown by the reference number 40 in FIG. 4(a).

In Step (2), a photoresist material is coated on the first layer of metal film to form a photoresist layer, and a pattern on a mask plate is transferred to the photoresist layer with an exposure device.

Figure 4:
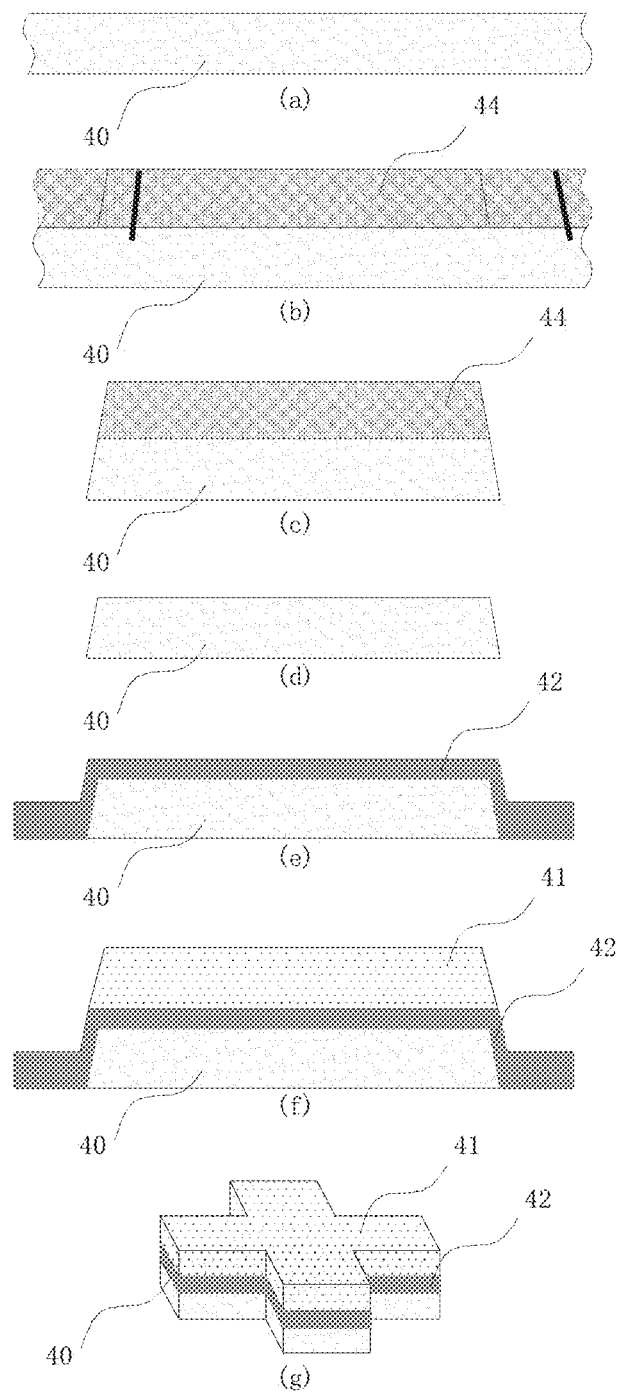
FIGS. 4(a) to 4(g) are flow charts of the method of manufacturing a positioning graphic component for substrate detection according to one embodiment of the present disclosure.

It should be noted that a photoresist material is a photosensitive material under ultraviolet irradiation. When ultraviolet irradiates on the photoresist material through a portion of the mask plate without graphic components, a portion of the photoresist material that is irradiated will be subject to chemical reactions, which is called as exposure. The portion of the photoresist material where chemical reactions have taken place is then removed through a process called as development by being soaked into a developer solution. After exposure and development, the graphic component on the mask plate can be transferred to the photoresist material, as shown in FIG. 4(b), wherein reference number 44 indicates a photoresist layer after development. In this step, the thickness of the photoresist material can be 1.5 μm±0.5 μm.

Preferably, the pattern on the mask plate includes a substantial cross. It can be easily understood that other graphic components can also be included besides the cross.

In Step (3), a portion of the first layer of metal film that is not covered by the photoresist material is etched through a wet etching.

This step is a process in which the metal layer is selectively removed.

Etching generally comprises wet etching, which uses an etching solution, and dry etching, which uses an etching gas, and can be selected depending upon the material of the deposited metal in Step (1). Since Step (3) adopts wet etching, a suitable etching solution should be selected.

The metal layer after being etched is shown in FIG. 4(c), wherein reference number 40 indicates the first layer of metal layer pattern, and 44 refers to the photoresist layer.

In Step (4), the photoresist material is removed to obtain the first layer of metal layer pattern.

As a high molecular material, the photoresist material plays an assistant role in formation of the metal pattern, and should be removed thereafter. As shown in FIG. 4(d), the first layer of metal layer pattern after removal of the photoresist material substantially constitutes a cross. So far, the first layer of metal layer pattern is formed.

In Step (5), an insulating material is deposited on the first layer of metal layer pattern formed through a chemical vapor deposition device to form a layer of insulating film.

The material of the insulating film preferably comprises silicon nitride. Due to the restriction of the chemical vapor deposition device, the formed insulating film may cover all, part, or none of the first layer of metal layer pattern. In the embodiment as shown in FIG. 4(e), an insulating film 42 covers all of the first layer of metal layer pattern 40.

In Step (6), a metal material is deposited on the insulating film through using a physical vapor deposition device to form a second layer of metal film.

In Step (7), a photoresist material is coated on the second layer of metal film, and the pattern on the mask plate is transferred to the photoresist material using an exposure device.

In Step (8), a portion of the second layer of metal film that is not covered by the photoresist material is etched via wet etching.

In Step (9), the photoresist material is removed to obtain a second layer of metal layer pattern, which is substantially in the form of a cross.

Through performing the above Steps (6) to (9), formation of the second layer of metal layer pattern can be accomplished. Herein, the more details about the four steps will not be repeatedly described, since specific implementation thereof are substantially the same as those of Steps (1) to (4), respectively.

The graphic component comprising the first layer of metal layer pattern, the second layer of metal layer pattern, and the insulating film placed between the two layers of metal layer patterns is finally used as the positioning graphic component for substrate detection. As shown in FIG. 4(f), reference numbers 40, 41, and 42 represent the first layer of metal layer pattern of the positioning graphic component, the second layer of metal layer pattern of the positioning graphic component, and the insulating film arranged therebeween, respectively.

FIG. 4(g) shows a perspective view of the positioning graphic component which substantially takes the form of a crass graphic component. Furthermore, the used mask plates comprise the same pattern during manufacture of the positioning graphic component. Hence, the second layer of metal layer pattern 41 and the portion of the first layer of metal layer pattern 40 that has not been etched are of the same size.

Moreover, the method of manufacturing the positioning graphic component may further relates to forming a semiconductor active layer by a deposition process, forming a channel protective film by a deposition process, forming the channel protective film, forming a semiconductor layer doped with impurities by a deposition process, forming the semiconductor layer doped with impurities, etc. Since these steps are all included in manufacturing an array substrate, they will not be repeatedly described here.

Figure 2:
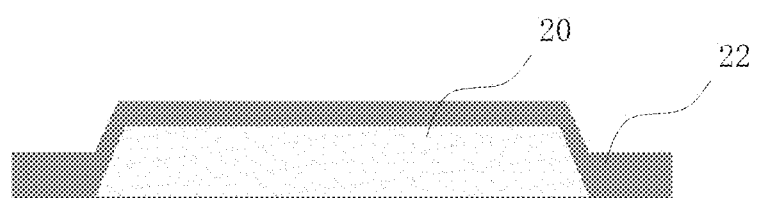
FIG. 2 is a cross-section view of the monolayer metal positioning graphic component as shown in FIG. 1 with reference to line AA'.
Figure 3:
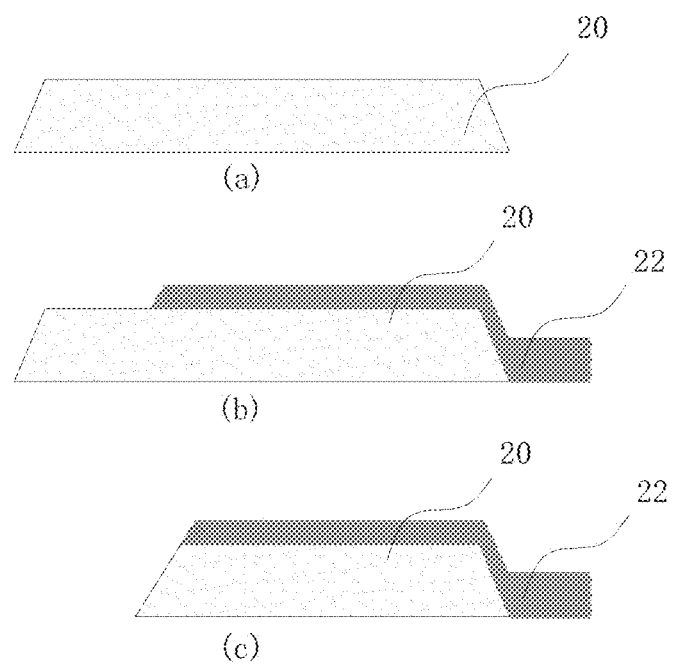
FIGS. 3(a) to 3(c) are flow charts of partially etching the monolayer metal positioning graphic component.

The main problem of an existing positioning graphic component (as shown in FIG. 2) lies in that its integrity can be assured only under the covering of an insulating film, and an uncovered portion of the component by the insulating film (as shown in FIG. 3(c)) will be etched during a subsequent etching step. The incomplete positioning graphic component would no longer meet the positioning requirements in subsequent substrate detection.

However, the positioning graphic component of the present embodiment is in the form of a cross having two layers of metal layer patterns. As shown in FIG. 4(f), the component comprises a first layer of metal layer pattern 40, the insulating film 42, and a second layer of metal layer pattern 41 from bottom to top. The embodiments shown in FIGS. 4(a) to 4(g) are in ideal condition. That is, the first layer of metal layer pattern is completely covered by the insulating film. Under this circumstance, the first layer of metal layer pattern can be protected from being etched in a subsequent etching step. As such, the completeness of the positioning graphic component can be guaranteed. Nonetheless, more generally, as a portion of the first layer of metal layer pattern that has not been covered by the insulating film is etched, the second layer of metal layer pattern will be necessary to ensure completeness of the positioning graphic component, which will be explained in the following with reference to FIG. 5.

Figure 5:
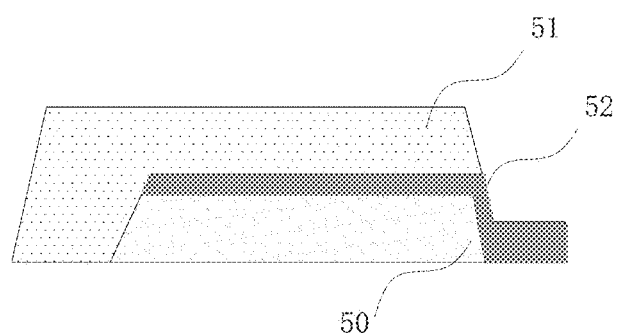
FIG. 5 is a cross-section view of a positioning graphic component for substrate detection according to one embodiment of the present disclosure.

FIG. 5 is a cross-section view of a positioning graphic component for substrate detection according to one embodiment of the present disclosure.

FIG. 5 indicates that incomplete coverage of a first layer of metal layer pattern 50 by an insulating film 52 causes a left portion of the first layer of metal layer pattern 50 to be etched in a subsequent etching step.

Afterwards, according to the steps as described above, a second layer of metal layer pattern is formed above the incomplete first layer of metal layer pattern in the same size as the first layer of metal layer pattern.

Specifically, as shown by the reference number 51 in FIG. 5, the deposited second layer of metal layer pattern first fills up the missing portion of the first layer of metal layer pattern. In this case, a new metal material is filled on the left side of the first layer of metal layer pattern that has been etched, forming a mixed metal layer. Then, the second layer of metal layer pattern is formed on the first layer of metal layer pattern which has been filled up.

Moreover, FIG. 5 further illustrates that the insulating film 52 arranged between the two layers of metal layer patterns of the positioning graphic component does not completely cover the first layer of metal layer pattern. The insulating film 52, however, does not affect the integrity of the resulting positioning graphic component. In the following, the principle that the completeness of the positioning graphic component would not be destroyed in subsequent steps will be explained in detail.

Typically, during manufacture of a TFT LCD array substrate, the wet etching is usually employed for etching a metal layer, in which different etching solutions are selected for different metal films. Commonly used etching solutions for the metal layer include the following mixed liquids: $HF+HNO_3$ ($+CH_3COOH$) (if the metal film to be etched is molybdenum, tantalum, or tungsten), $H_3PO_4+HNO_3$ ($+CH_3COOH$) (if the metal film to be etched is aluminum), and $(NH_4)_2Ce(NO_3)_6+HClO_4+H_2O$ (if the metal film to be etched is chromium). The etching solution commonly used for non-crystalline silicon is $HF+HNO_3$ ($+CH_3COOH$), and that commonly used for pixel electrodes is $HCl+HNO_3$.

Generally, after formation of the second layer of metal layer pattern, only the etching of pixel electrodes is to be performed. Since the etching solution selected for this procedure has no influence on the metal layer, the formed positioning graphic component will not be etched. As such, completeness of the component can be assured.

As a result, the positioning graphic component comprising two layers of metal layer patterns of the present disclosure can solve the problems in the prior art.

Figure 6:
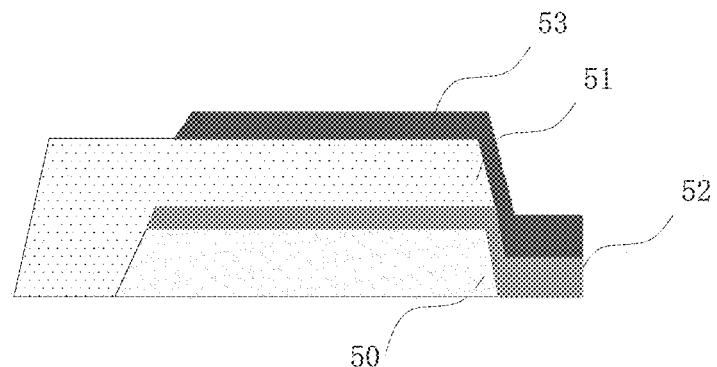
FIG. 6 is a cross-section view of a positioning graphic component for substrate detection according to another embodiment of the present disclosure.

In addition, in order to better ensure the completeness of the positioning graphic component, an insulating film, such as an insulating film 53 as shown in FIG. 6, can be further deposited on the second layer of metal layer pattern.

As can be seen from the above, the method according to the embodiments of the present disclosure enables a complete positioning graphic component even when the first layer of the positioning graphic component is partially etched. Hence, positioning in subsequent defection of substrate would not be affected.

It should be noted that although the above embodiments only explain positioning graphic components comprising two layers, positioning graphic components comprising more than two layers of metal layer patterns can be manufactured also in certain conditions, which can be easily understood.

Although the embodiments disclosed by the present disclosure are discussed above, the embodiments are provided for better understanding of the present disclosure rather than to limit the present disclosure. Anyone skilled in the art, without departing from the spirit or scope of the present disclosure, can make amendments or modification to the implementing forms and details of the embodiments. Regarding the scope of the present disclosure, however, the scope of the claims shall prevail.

The invention claimed is:

1. A method of manufacturing a positioning graphic component for substrate detection, comprising at least the following steps:

Step (1): depositing a metal material on a substrate to form a first layer of metal film;

Step (2): coating a photoresist material on the first layer of metal film, and transferring a pattern on a mask plate to the photoresist material;

Step (3): etching a portion of the first layer of metal film that is not covered by the photoresist material;

Step (4): removing the photoresist material to obtain a first layer of metal layer pattern;

Step (5): depositing an insulating material on the first layer of metal layer pattern to form a layer of insulating film;

Step (6): depositing a metal material to form a second layer of metal film on the insulating film;

Step (7): coating a photoresist material on the second layer of metal film, and transferring the pattern on the mask plate to the photoresist material;

Step (8): etching a portion of the second layer of metal film that is not covered by the photoresist material; and Step (9): removing the photoresist material to obtain a second layer of metal layer pattern, wherein the graphic component at least comprising the first layer of metal layer pattern, the second layer of metal layer pattern, and the insulating film is used as the positioning graphic component for substrate detection.

2. A positioning graphic component for substrate detection, comprising:
    at least two layers of metal layer patterns, and
    an insulation layer placed between any two layers of metal layer patterns,
    wherein the positioning graphic component for substrate detection is manufactured by the method claim 1.

3. The positioning graphic component for substrate detection of claim 2, wherein the metal layer pattern includes a cross.

4. The positioning graphic component for substrate detection of claim 2, wherein the at least two layers of metal layer patterns are of the same size.

5. The positioning graphic component for substrate detection of claim 2, further comprising an insulation layer covering an outermost layer of the at least two layers of metal layer patterns.

6. The method of claim 1, further comprising depositing an insulating material on the second layer of metal layer pattern to form a layer of insulating film.

7. The method of claim 1, wherein the pattern on the mask plate comprises a cross.

8. The method of claim 6, wherein the pattern on the mask plate comprises a cross.

9. The method of claim 7, wherein the portion of the first or second layer of metal film that is not covered by the photoresist material is etched via wet etching.

10. The method of claim 8, wherein the portion of the first or second layer of metal film that is not covered by the photoresist material is etched via wet etching.

* * * * *